United States Patent
Park

(10) Patent No.: US 6,709,972 B2
(45) Date of Patent: Mar. 23, 2004

(54) METHODS FOR FABRICATING SEMICONDUCTOR DEVICES BY FORMING GROOVES ACROSS ALTERNATING ELONGATED REGIONS

(75) Inventor: Je-min Park, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/340,975

(22) Filed: Jan. 13, 2003

(65) Prior Publication Data

US 2003/0235948 A1 Dec. 25, 2003

(30) Foreign Application Priority Data

Jun. 19, 2002 (KR) .................................... 2002-0034385

(51) Int. Cl.$^7$ ......................................... H01L 21/4763
(52) U.S. Cl. ...................................................... 438/622
(58) Field of Search ........................ 438/622, 625–626, 438/631, 637, 639, 675

(56) References Cited

U.S. PATENT DOCUMENTS 5,792,703 A * 8/1998 Bronner et al. ............. 438/620

* cited by examiner

*Primary Examiner*—Craig A. Thompson
(74) *Attorney, Agent, or Firm*—Myers Bigel Sibley & Sajovec

(57) ABSTRACT

A semiconductor device is fabricated by forming a series of alternating first and second elongated regions on a substrate, and etching elongated trenches that are nonparallel to and extend across the first and second elongated regions. Material is placed in the elongated trenches. Portions of the first and/or second elongated regions are removed between adjacent ones of the elongated trenches that contain material therein, to define contact holes. Conductive material is placed in at least some of the portions of the first and/or second elongated regions that are selectively removed.

24 Claims, 15 Drawing Sheets

METHODS FOR FABRICATING SEMICONDUCTOR DEVICES BY FORMING GROOVES ACROSS ALTERNATING ELONGATED REGIONS

RELATED APPLICATION

This application claims the benefit of Korean Patent Application No. 2002-0034385, filed Jun. 19, 2002, the disclosure of which is hereby incorporated herein by reference in its entirety as if set forth fully herein.

FIELD OF THE INVENTION

The present invention relates to methods for fabricating semiconductor devices, and more particularly, to methods for fabricating interconnections for semiconductor devices.

BACKGROUND OF THE INVENTION

As the integration density of integrated circuit devices continues to increase, the distance between semiconductor devices in the integrated circuit may continue to decrease. As a result, the contacts to the individual devices may also decrease in size, which may reduce the alignment margin tolerances for the photolithography processes that are used to form these contact regions. Contact failures may result.

Photolithography is widely used to form desired patterns in semiconductor fabrication processes. However, as the density of these patterns continues to increase, it may be difficult to form the desired pattern using photolithography.

One particular example is the formation of a bit line of an integrated circuit memory device, such as a Dynamic Random Access Memory (DRAM). For a design rule of 0.1 μm, the bit line size may be about 100 nm, and the misalignment margin may be about 40 nm. In this environment, the size of a storage node contact should be about 40 nm, which may be difficult to form using conventional exposure and photolithography processes. Increasing the storage node contact size beyond about 40 nm may reduce the misalignment margin, and a short circuit may occur between the storage node contact plug and a bit line, which may cause device failure.

Self-aligned contact processes are known, which can provide minimum misalignment margin in the photolithography process. Storage node contacts have been formed using self-aligned contact processes. However, even these self-aligned processes may use photolithography steps. Accordingly, it may be desirable to provide methods of fabricating semiconductor devices, wherein small contact holes, such as storage node contact holes, may be formed while preserving a desired misalignment margin.

SUMMARY OF THE INVENTION

Some embodiments of the present invention fabricate a semiconductor device by forming a series of alternating first and second elongated regions on a substrate, and etching a plurality of elongated trenches that are nonparallel to and extend across the first and second elongated regions. Material is placed in the plurality of elongated trenches. Portions of the first and/or second elongated regions are removed between adjacent ones of the plurality of elongated trenches that contain material therein, to define contact holes. In some embodiments, conductive material is placed in at least some of the portions of the first and/or second elongated regions that are selectively removed. In other embodiments, holes are etched beneath at least some of the portions of the first and/or second elongated regions that are selectively removed, and conductive material is placed in at least some of the portions of the first and/or second elongated regions that are selectively removed and in the holes beneath these portions. In other embodiments, sidewall spacers are formed in the plurality of elongated trenches, and conductive material is placed between the sidewall spacers. Sidewall spacers also may be formed in the portions of the first and/or second elongated regions that are selectively removed prior to placing conductive material therein.

According to other embodiments of the invention, a semiconductor device is fabricated by depositing a lower insulating film and an upper insulating film having line patterns therein on a substrate, forming a mask film in spaces between the line patterns and planarizing the mask film until a surface of the line patterns is exposed. Grooves which extend across the line patterns are formed in the lower insulating film, by patterning the line patterns and the mask films. A spacer is formed on the sidewalls of the grooves and a conductive layer is formed in the grooves between the sidewalls. The conductive layer is covered with a capping film and the capping film is planarized until a surface of the patterned mask film is exposed. Contact holes are formed that are aligned to the conductive layer by selectively removing the mask film between adjacent portions of the conductive layer and the capping film. The lower portions of the contact holes are extended by removing the lower insulating film beneath the contact holes. Contact plugs are formed by forming a conductive substance in the contact holes.

In some embodiments, the mask film comprises a film having a etching selectivity to the upper insulating film and the capping film. For example, the mask film may be a nitride film and the upper insulating film and the capping film may be oxide films.

According to other embodiments of the present invention, there is provided methods for fabricating semiconductor devices comprising forming gate stacks on, and sources/drains in a substrate, covering spaces between the gate stacks with a first insulating film and planarizing the first insulating film, and forming first cell pads connected to respective sources and second cell pads connected to respective drains through the first insulating film. These embodiments further comprise forming a second insulating film on the first insulating film, the first cell pads and the second cell pads, forming a bit line contact plugs contacting the second cell pads through the second insulating film and forming a third insulating film on the second insulating film and the bit line contact plugs. These embodiments further comprise forming line patterns which expose a region where a storage node contact plug is to be formed and is parallel to the gate stacks, by etching the third insulating film, covering spaces between the line patterns with a mask film and planarizing the mask film until a surface of the line patterns is exposed, and forming reverse patterns which define grooves for bit lines, by patterning the line patterns and the mask film at the same time. Finally, these embodiments further comprise forming a first spacer on the sidewalls of the reverse patterns, forming the bit lines by covering spaces between the reverse patterns, where the first spacer is formed, with a conductive layer, covering the bit lines with a capping film which fills spaces between the reverse patterns and planarizing the capping film until the reverse patterns are exposed. Storage node contact holes are formed, which expose the second insulating film, by wet etching the patterned mask film of the resultant structure where the capping film is formed. The lower portions of the storage node contact holes are extended by dry etching the exposed second insulating film, and the storage node contact plugs are formed by filling the storage node contact holes with a conductive substance.

In some embodiments, active regions where the sources and drains are formed are orthogonal to the gate stacks. However, in other embodiments, the active regions may also have a diagonal structure where the active regions are aligned with the gate stacks at an acute angle.

In some embodiments, the mask film is a film having a wet-etching selectivity to the third insulating film, the first spacer, and the capping film. For example, the mask film may be a nitride film and the third insulating film, the first spacer, and the capping film may be oxide films.

After the storage node contact holes, which expose the second insulating film, are formed by wet etching the patterned mask film, some embodiments form a second spacer on the inner walls (sidewalls) of the storage node contact holes. Some embodiments also extend the lower portions of the storage node contact holes by dry etching the exposed second insulating film, using the capping film and the second spacer as etching masks.

After the lower portions of the storage node contact holes are extended, a third spacer may be formed on the inner walls of the extended storage node contact holes, in other embodiments.

DETAILED DESCRIPTION

Figure 1A:
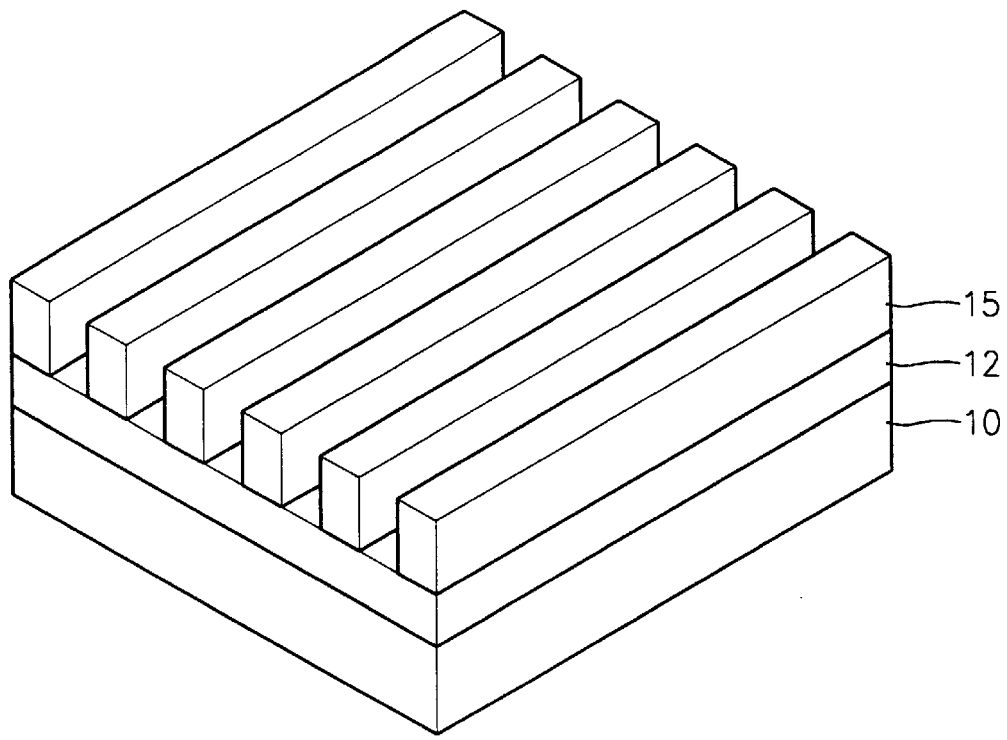
FIGS. 1A through 1F are perspective views of methods for fabricating semiconductor devices according to first embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

First Embodiments

FIGS. 1A through 1F are perspective views for explaining methods for fabricating semiconductor devices according to first embodiments of the present invention.

Referring to FIG. 1A, a lower insulating film 12 is formed on a substrate 10 such as an integrated circuit substrate, and an upper insulating film is formed on the lower insulating film 12, remote from the substrate 10. Line patterns 15 are formed by etching the upper insulating film. In order to prevent the lower insulating film 12 from being etched, the time for etching the upper insulating film may be adjusted, and/or an additional etch stopping film may be formed between the lower insulating film 12 and the upper insulating film so that etching for the upper insulating film can be halted on the etch stopping film.

Figure 1B:
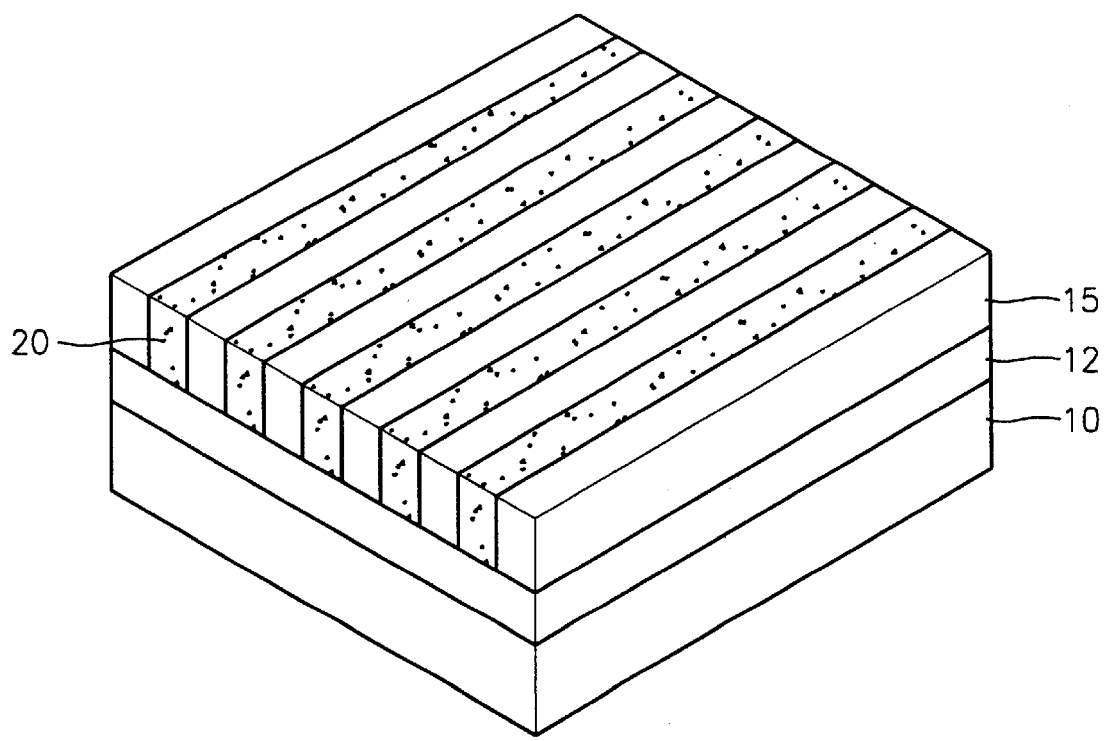

Referring to FIG. 1B, spaces between the line patterns 15 are filled with a mask film 20, and the resultant structure is planarized until the surface of the line patterns 15 appears. Thus, a series of alternating first and second elongated regions, also designated by reference numerals 15 and 20, respectively, are formed. The method used to planarize the mask film 20 can be an etch back method, chemical mechanical polishing (CMP) and/or other techniques. In some embodiments, the mask film 20 is formed of a film having an etching selectivity to the upper insulating film. For example, the upper insulating film may comprise an oxide film, and the mask film 20 may comprise a nitride film.

Figure 1C:
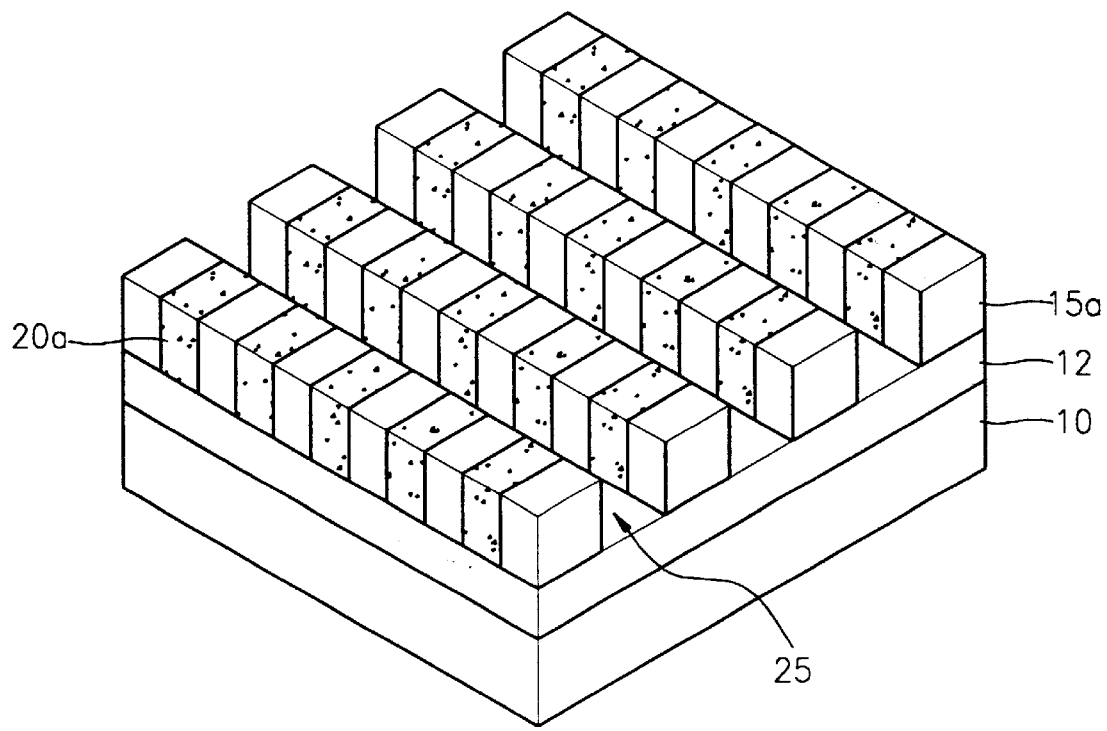

Referring to FIG. 1C, the line patterns 15 and the mask film 20 are patterned at the same time so as to form interconnection grooves 25 that may extend orthogonal to the line patterns 15 on the lower insulating film 12. Thus, a plurality of elongated trenches, also designated by reference numerals 25, may be formed. The elongated trenches 25 are nonparallel to and extend across the series of first and second elongated regions 15 and 20, respectively. Reference numerals 15a and 20a indicate the patterned line patterns 15 and patterned mask film 20, respectively. According to some embodiments of the present invention, at least some of the patterned mask film 20a is later removed so as to form a contact hole where the patterned mask film 20a is formed. In order to form the contact hole in a later step, the patterned mask film 20a may be left in only the desired location during a step shown in FIG. 1C. Therefore, the line pattern 15 and the interconnection grooves 25 may be formed after the location of a contact hole is considered.

Figure 1D:
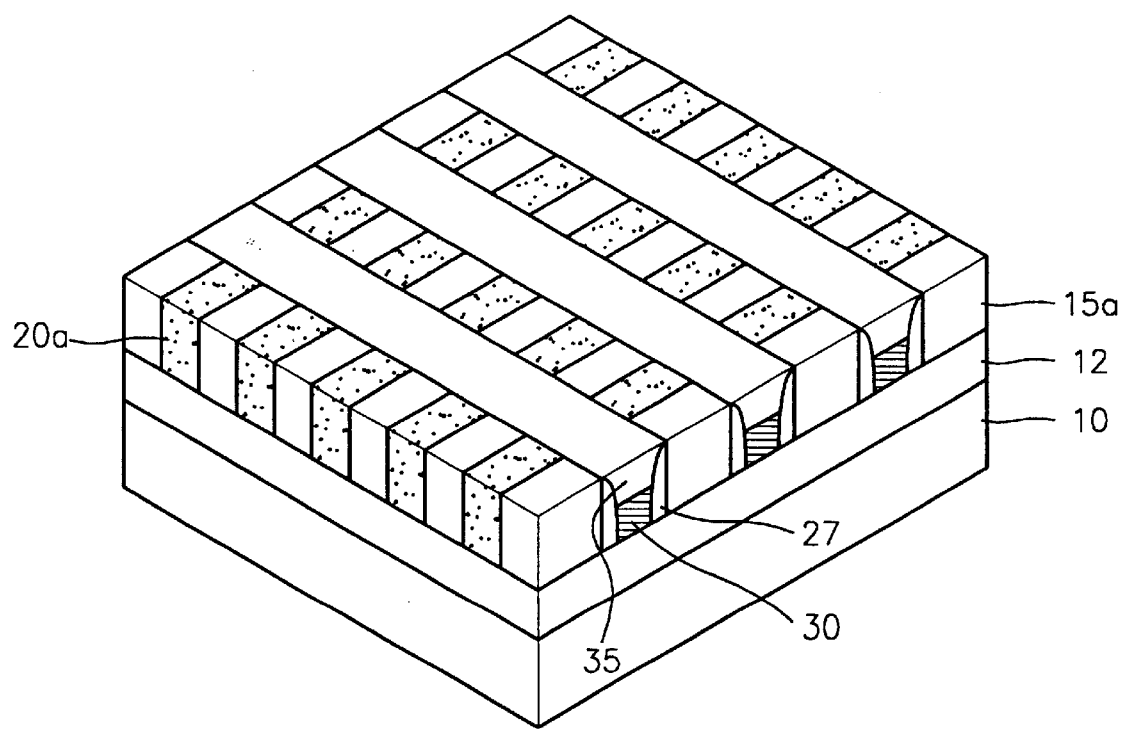

Referring to FIG. 1D, a spacer 27 is formed on sidewalls of the interconnection grooves 25, and then the interconnection grooves 25 are at least partially filled with a conductive layer so as to form damascene interconnections 30. The spacer 27 can protect the interconnections 30 from being etched when the patterned mask film 20a is removed by etching. Accordingly, in some embodiments, the spacer 27 comprises a film having an etching selectivity to the patterned mask film 20a and therefore the spacer 27 may comprise an oxide film similar to the upper insulating film.

Next, the interconnections 30 are covered with a capping film 35 and are planarized until the patterned mask film 20a appears. The method for planarizing the capping film 35 may be an etch back method, CMP and/or other techniques. In some embodiments, the capping film 35 also comprises a film having an etching selectivity to the patterned mask film 20*a* and therefore, in some embodiments, the capping film 35 may comprise an oxide film similar to the upper insulating film.

Figure 1E:
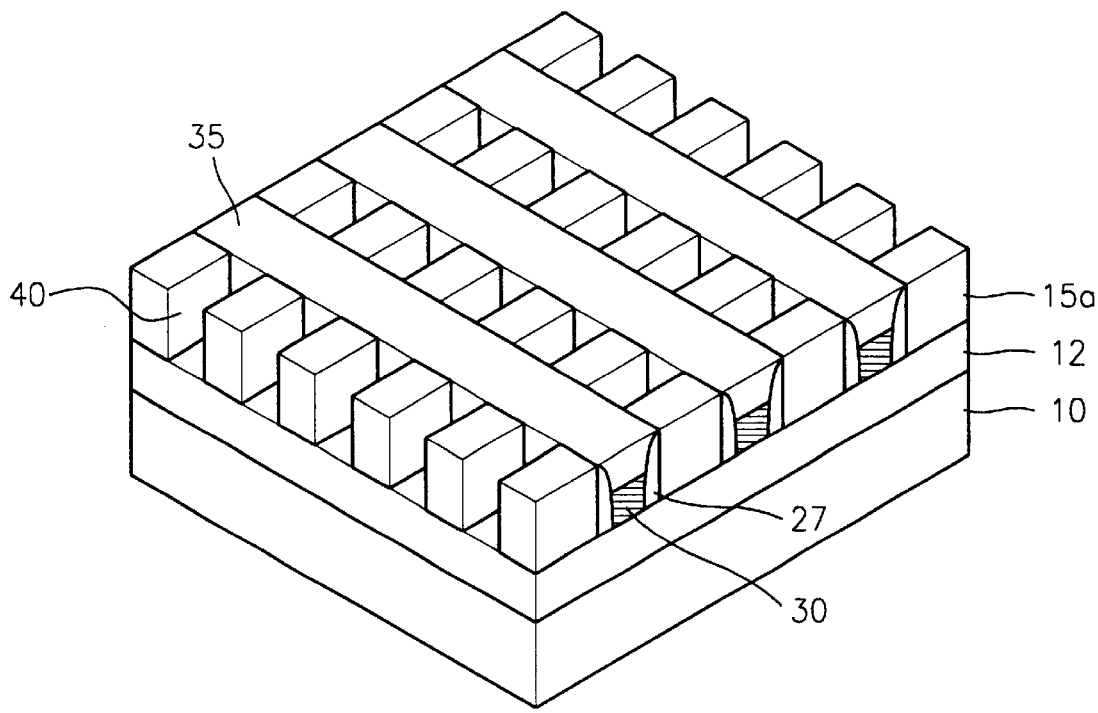

Referring to FIG. 1E, the patterned mask film 20*a* is selectively removed from the resultant structure of FIG. 1D to form a naturally-aligned contact hole 40. Thus, portions of the first and/or second elongated regions 15*a* and/or 15*b* are selectively removed between adjacent ones of the plurality of elongated trenches 25 that contain material 30 therein. In some embodiments, the patterned mask film 20*a* is comprises a nitride film, unlike the upper insulating film, the spacer 27, and the capping film 35, which comprise an oxide film. Therefore, if a stripping method using phosphoric acid ($H_3PO_4$) is applied to the resultant structure of FIG. 1D, only the patterned mask film 20*a* is selectively removed. The spacer 27 protects the interconnection 30 when the patterned mask film 20*a* is removed.

As described above, in these embodiments, the contact holes 40 need not be formed using a photolithography process but can be formed in places where the patterned mask film 20*a* is removed to obtain the contact holes 40 before the interconnections 30 are formed. Therefore, it is possible to reduce or eliminate misalignment in comparison with the conventional process for forming the contact hole using photolithography after the interconnections are formed.

Figure 1F:
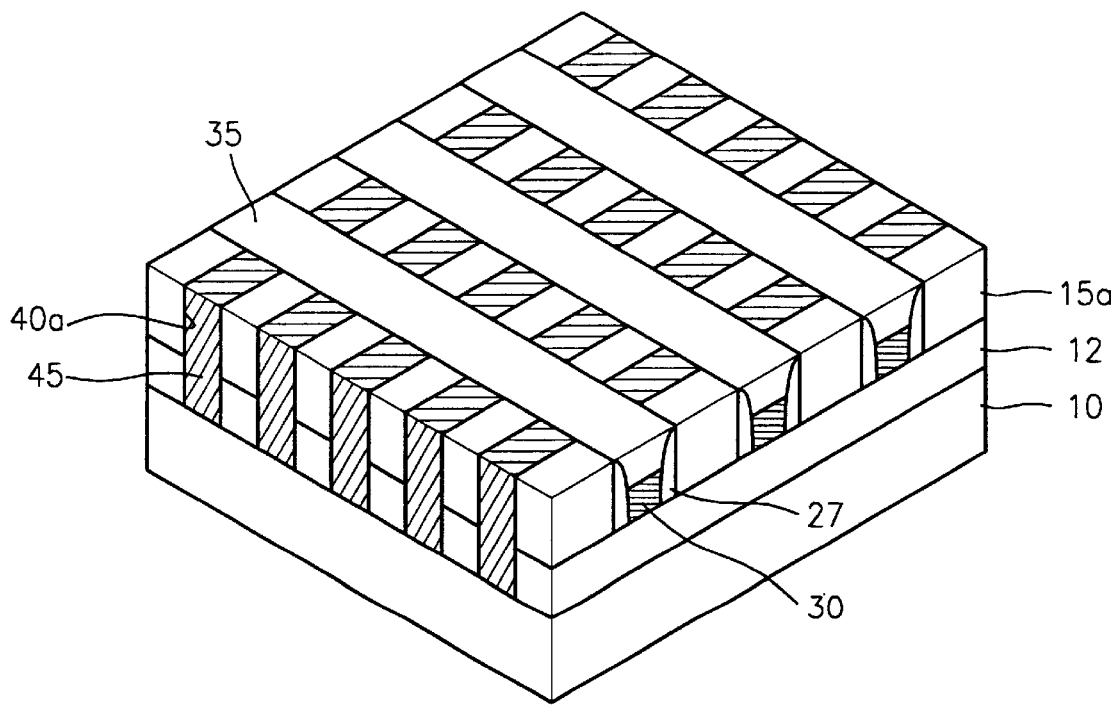

Referring to FIG. 1F, the lower insulating film 12 under the contact holes 40 is removed to extend the lower portions of the contact holes 40 to the substrate 10. Reference numeral 40*a* indicates a contact hole whose lower portion has been extended. The contact holes 40*a* are at least partially filled with a conductive substance to form contact plugs 45. It is also possible to form a spacer on the sidewalls of the contact holes 40*a* before the contact holes 40*a* are at least partially filled with a conductive substance. If so, the insulating characteristics between the contact plugs 45 and the interconnections 30 may be further improved.

As described above, in these embodiments, the contact hole region may be obtained by covering the contact hole region with the patterned mask film and then forming the interconnection. After that, the contact holes are formed by selectively removing the patterned mask film. Since the misalignment margin may be fully obtained in comparison with conventional methods where the contact hole is formed by a photolithography process after the interconnection is formed, it is possible to fabricate a semiconductor device with reduced numbers of short circuits occurring between the interconnection and the contact plug. Therefore, these embodiments can be applied to highly-integrated semiconductor devices.

Second Embodiments

Figure 2:
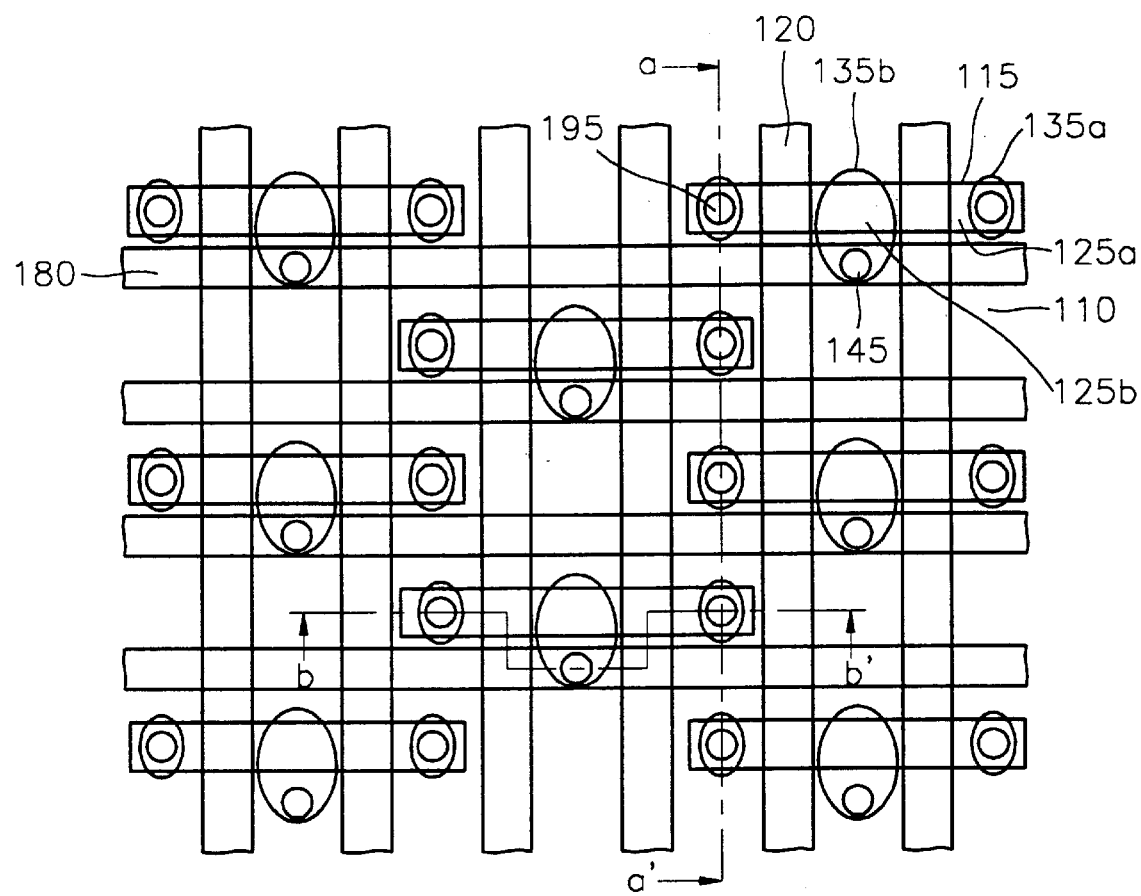
FIG. 2 is a layout of a DRAM cell as implemented according to embodiments of the present invention.

In these embodiments, forming a contact hole for a storage node contact plug after forming the bit line of a DRAM by a damascene process will be described. FIG. 2 is a layout of a DRAM cell as implemented according to some embodiments of the present invention. FIGS. 3A through 8A are sectional views, taken along line a—a' of FIG. 2, sequentially showing methods for fabricating semiconductor devices according to the second embodiments of the present invention. FIGS. 3B through 8B are sectional views, taken along line b—b' of FIG. 2, sequentially showing methods for fabricating semiconductor devices according to the second embodiments of the present invention. FIGS. 4C through 8C are top views sequentially showing methods for fabricating semiconductor devices according to the second embodiments of the present invention.

Referring to FIG. 2, active regions 115 having long axes and short axes are repeatedly aligned on the substrate in a column direction and a row direction. These directions need not be orthogonal. Regions other than the active regions 115 are defined by an isolation layer 110. Gate stacks 120 extending in the direction of the short axes of the active regions 115 are, in some embodiments, orthogonal to the active regions 115, and two gate stacks are aligned for each of the active regions 115. A source 125*a* and a drain 125*b* are formed in the active regions 115 on respective sides of the gate stacks 120. In the source 125*a* and the drain 125*b*, the contact regions are formed by first and second cell pads 135*a* and 135*b*, respectively. A bit line contact plug 145 is formed on the second cell pad 135*b*, which contacts the drain 125*b*, and on the bit line contact plug 145, bit line stacks 180 are aligned perpendicular to the direction the gate stacks 120 extend. On the first cell pad 135*a*, which contacts the source 125*a*, a contact region is formed by the storage node contact plug 195.

Figure 3A:
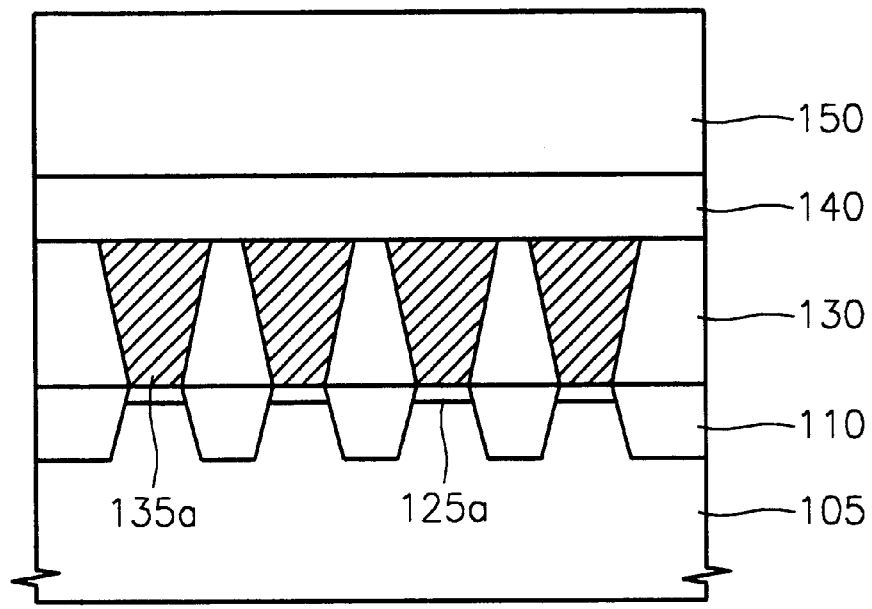
FIGS. 3A, 4A, 5A, 6A, 7A and 8A are sectional views, taken along line a—a' of FIG. 2, sequentially showing methods for fabricating semiconductor devices according to second embodiments of the present invention.
Figure 3B:
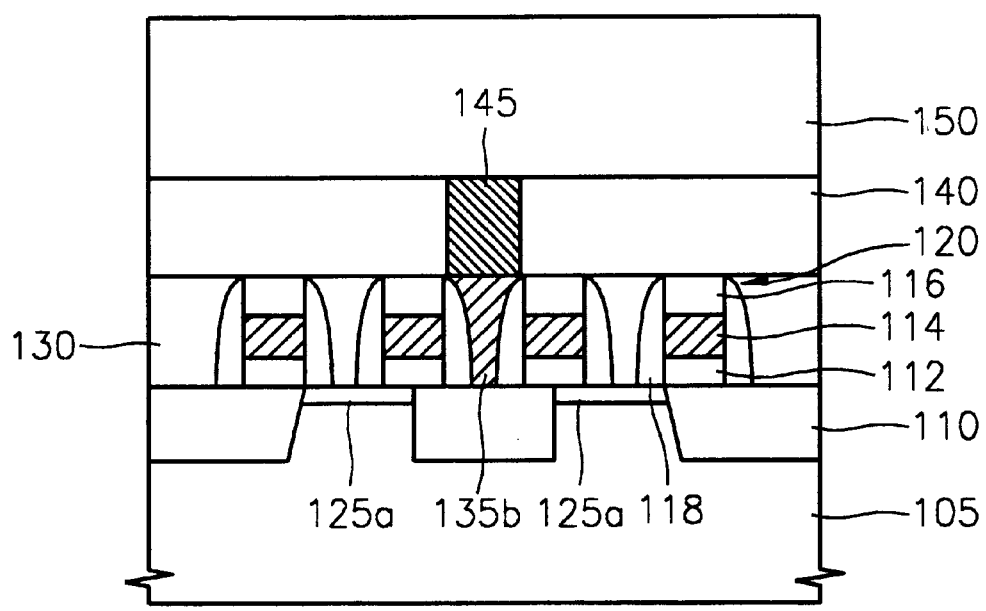
FIGS. 3B, 4B, 5B, 6B, 7B, and 8B are sectional views, taken along line b—b' of FIG. 2, sequentially showing methods for fabricating semiconductor devices according to the second embodiments of the present invention.

Next, referring to FIGS. 3A and 3B, the isolation layer 110 which defines the active regions 115 shown in FIG. 2 is formed on a substrate 105 using a shallow trench isolation (STI) method, and/or the like. On the substrate 105 where the isolation layer 110 is formed, the gate stacks 120, the source 125*a*, and the drain 125*b* are formed.

The gate stacks 120 are formed by forming a gate insulating film 112, a gate conductive layer 114, and a hard mask film 116, patterning them, and forming a gate spacer 118 on sidewalls of the patterned hard mask film 116, gate conductive layer 114 and gate conductive film 112. Further, the source 125*a* and the drain 125*b* are formed by implanting impurities into the substrate 105 on both sides of each of the gate stacks 120.

Next, the gate stacks 120 are covered with a first insulating film 130 to at least partially fill the spaces between the gate stacks 120 and are planarized by the CMP process where the hard mask film 116 is used as a stopper. The first insulating film 130 comprises a substance having a different etching selectivity from the hard mask film 116 and the gate spacer 118.

After that, a predetermined region of the first insulating film 130 is etched to expose the source 125*a* and the drain 125*b*. Here, the gate conductive layer 114 is surrounded by the hard mask film 116 and the gate spacer 118. Since the first insulating film 130 has a different etching selectivity from the hard mask film 116 and the gate spacer 118, contact holes are formed along sides of the hard mask film 116 and the gate spacer 118 using a self-aligned contact (SAC) method. The contact holes are at least partially filled with a conductive layer to form the first cell pad 135*a* connected to the source 125*a* and the second cell pad 135*b* connected to the drain 125*b*.

Then, a second insulating film 140 is formed on the first insulating film 130, the first cell pad 135*a*, and the second cell pad 135*b*, and the bit line contact plug 145 which contacts the second cell pad 135*b* through the second insulating film 140 is formed.

In order to form a damascene bit line on the second insulating film 140 having the bit line contact plug 145, a third insulating film 150 having a thickness of about 500 Å to about 7000 Å is formed on the second insulating film 140. An etch stop film can be formed between the second insulating film 140 and the third insulating film 150.

Figure 4A:
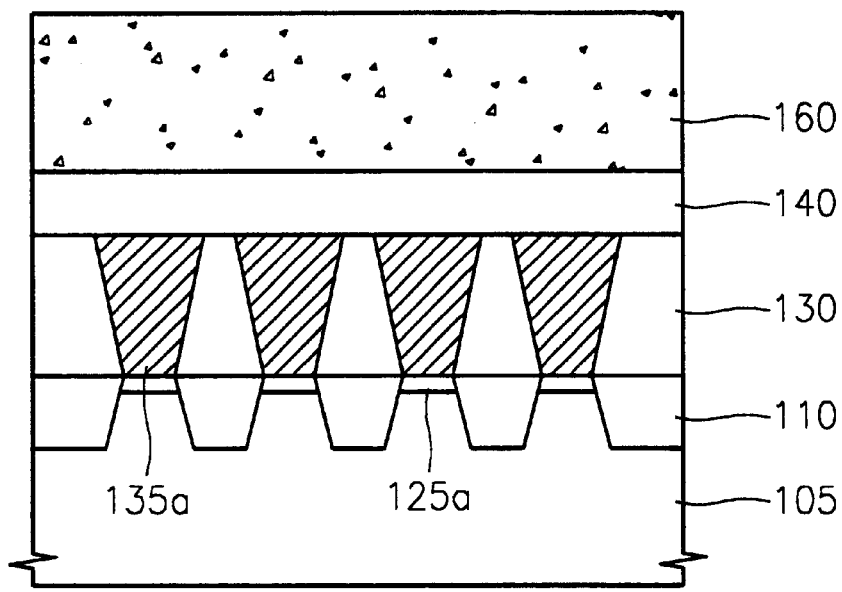
Figure 4B:
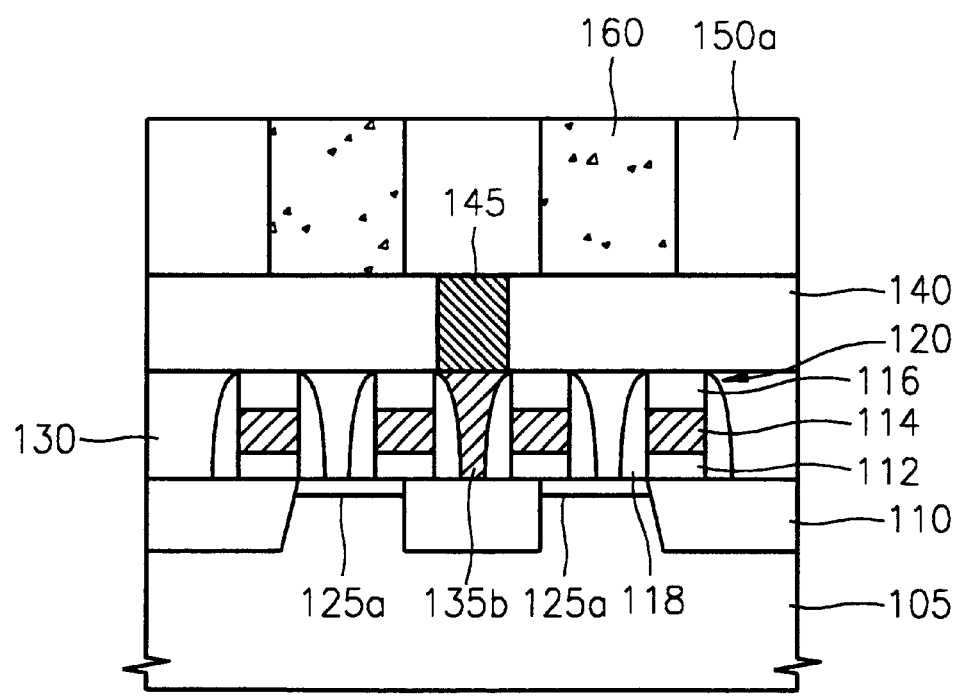
Figure 4C:
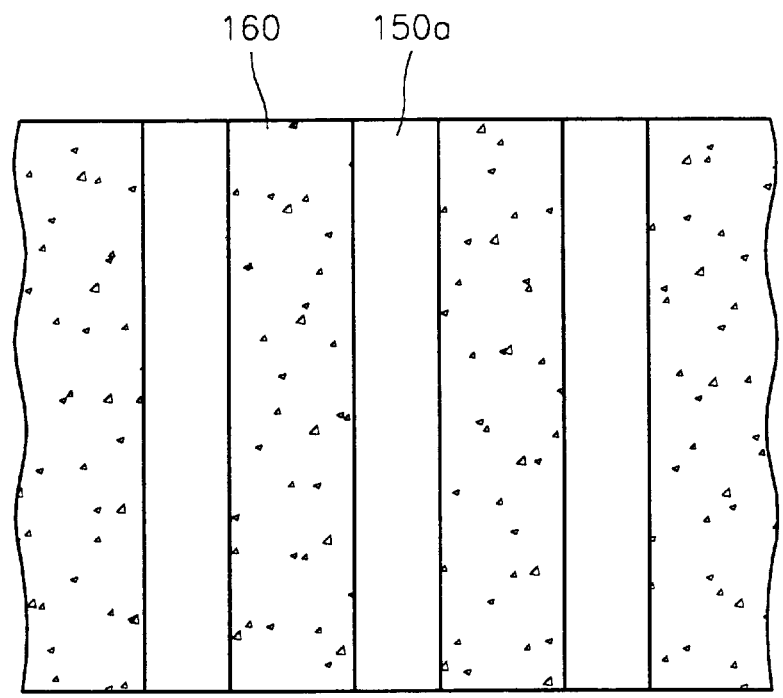
FIGS. 4C, 5C, 6C, 7C, and 8C are top views sequentially showing methods for fabricating semiconductor devices according to the second embodiments of the present invention.

Referring FIGS. 4A through 4C, the third insulating film 150 is etched to expose a region where a storage node contact plug 195 is to be formed, as shown in the layout of FIG. 2, and to form line patterns 150*a* parallel to the gate stacks 120. Here, since the patterning size is larger than the Critical Dimension (CD) of the gate stacks 120, the photolithography process used for patterning the gate insulating film 112, the gate conductive layer 114, and the hard mask film 116 can be sufficient for the above process.

If the etch stop film is formed between the second insulating film 140 and the third insulating film 150, the third insulating film 150 is etched until the etch stop film is exposed, and then the etch stop film is removed to expose the second insulating film 140. Otherwise, the time for etching the third insulating film 150 may be adjusted to etch only the third insulating film 150 and to prevent the second insulating film 140 from being etched.

Next, the spaces between the line patterns 150a are at least partially filled with the mask film 160, and the resultant structure is planarized until the surface of the line patterns 150a appears. The mask film 160 can have a thickness of about 500 Å to about 10000 Å. The method used to planarize the mask film 160 may be etch back, CMP and/or other techniques. In some embodiments, the mask film 160 should have a high wet-etching selectivity to the third insulating film 150. For example, if the third insulating film 150 comprises an oxide film, the mask film 160 can comprise a nitride film.

Figure 5A:
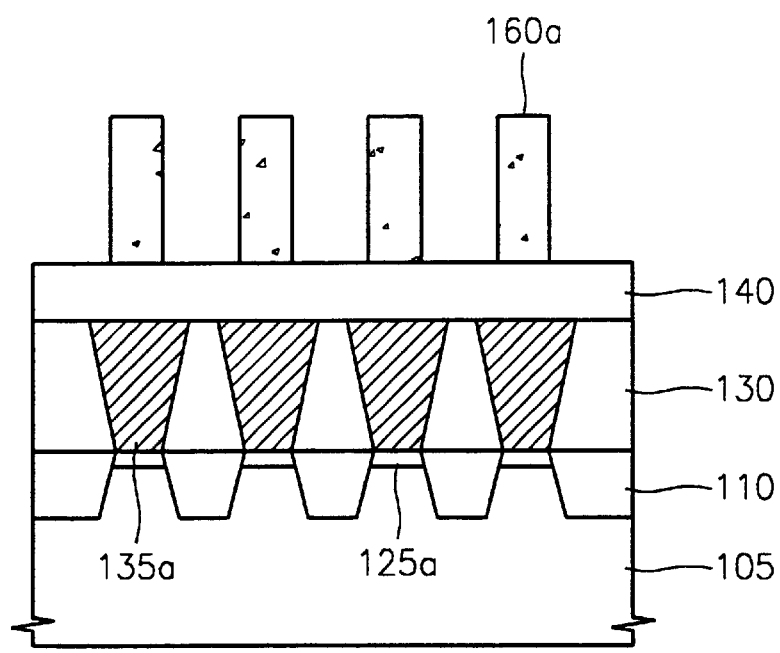
Figure 5B:
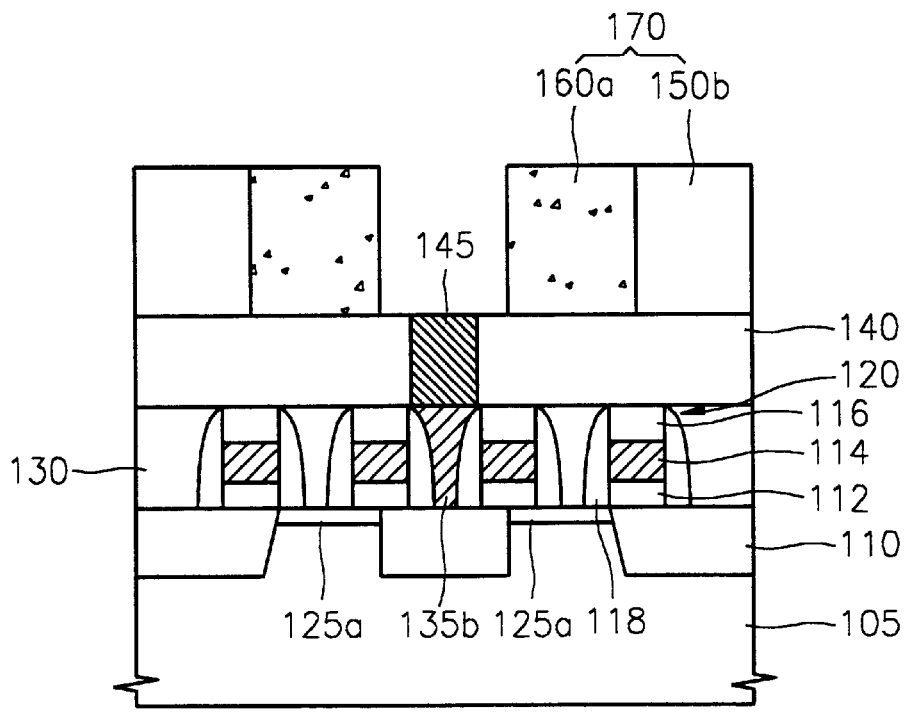
Figure 5C:
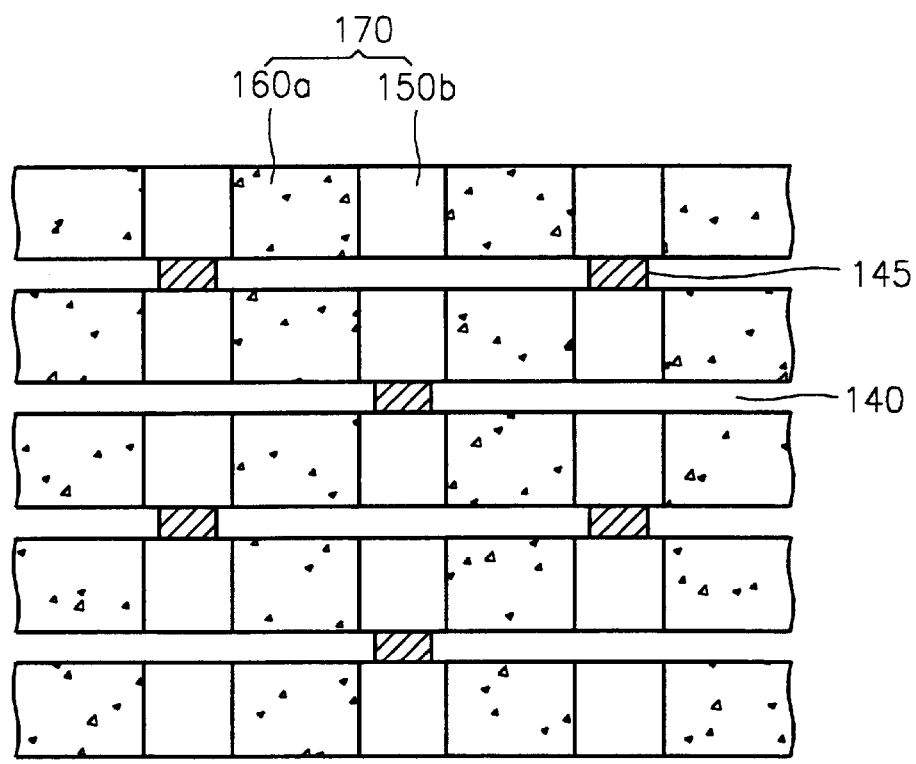

Referring to FIGS. 5A through 5C, reverse patterns 170 are formed to define grooves or trenches, by patterning the line patterns 150a and the mask film 160 at the same time. The reverse pattern 170 includes the patterned line patterns 150b and the patterned mask film 160a. In some embodiments, the patterned mask film 160a is located only in the region where the storage node contract plug 195 is to be formed as shown in the layout of FIG. 2.

Figure 6A:
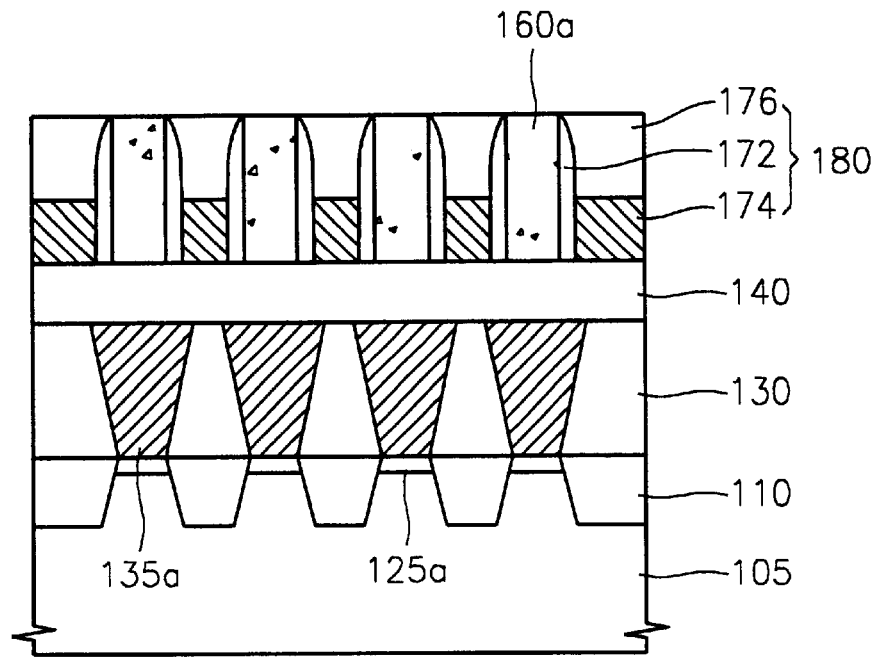
Figure 6B:
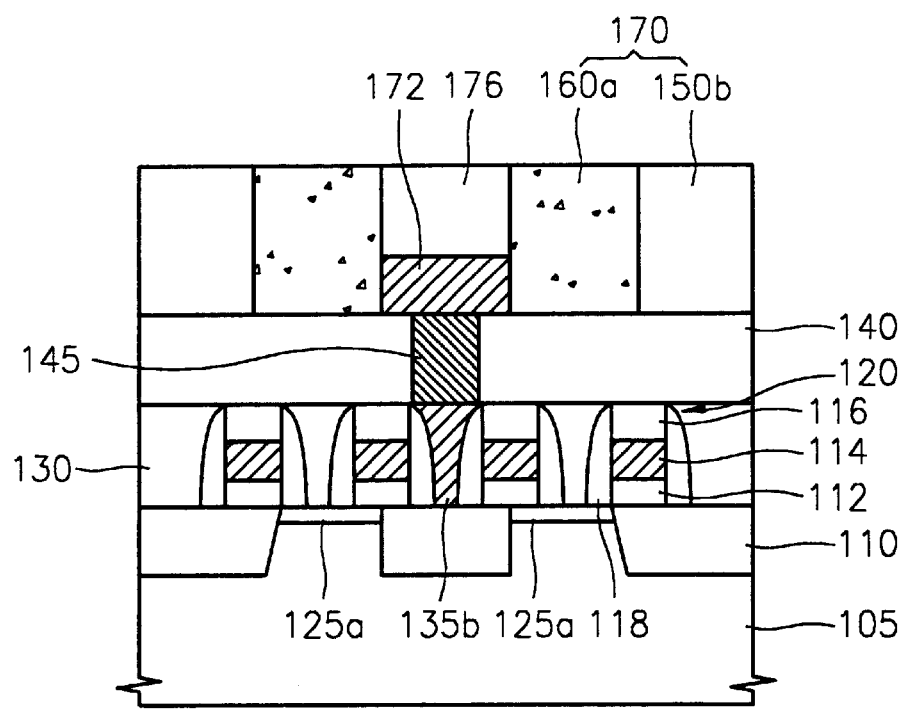
Figure 6C:
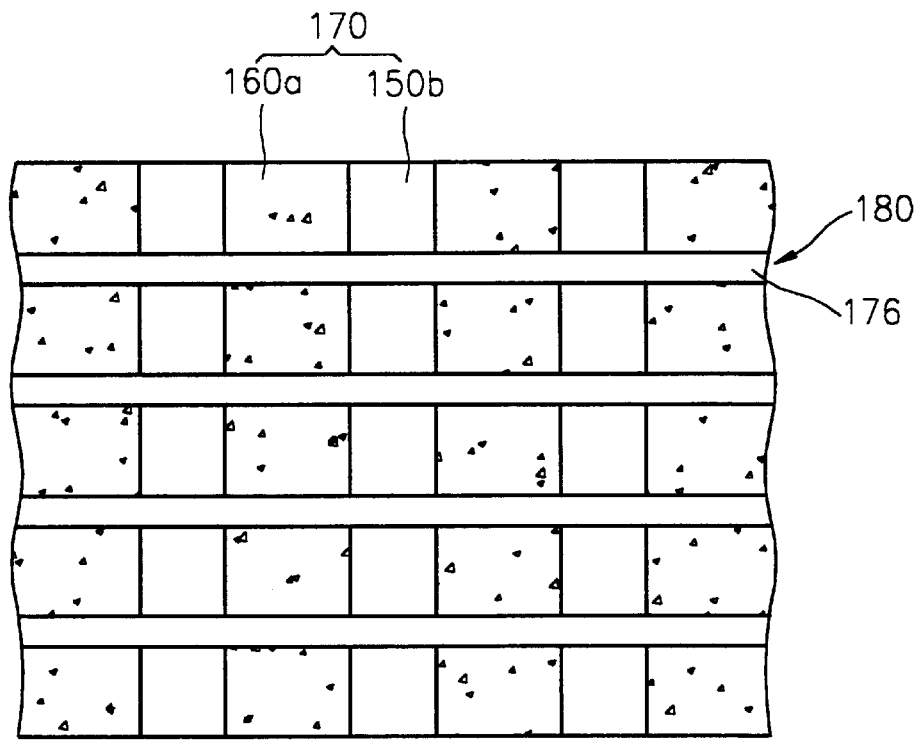

Referring to FIGS. 6A through 6C, a first spacer 172 having a thickness of about 100 Å to about 2000 Å is formed on sidewalls of the reverse patterns 170. For forming the first spacer 172, the whole surface of the resultant structure where the reverse patterns 170 are formed is covered with an insulating film for a spacer, and the resultant structure is etched back. In some embodiments, the insulating film for a spacer also has a high etching selectivity to the patterned mask film 160a. Therefore, the insulating film for the first spacer 172 may comprise the same material as the third insulating film 150. The first spacer 172 protects the bit line from being etched in a subsequent wet etching process.

Next, the grooves or trenches between the reverse patterns 170 are at least partially filled with a conductive layer to form a bit line 174. In order to form the bit line 174, the surface of the resultant structure where the first spacer 172 is formed is covered with the conductive layer and etched back to form the conductive layer between the reverse patterns 170. The conductive layer can comprise a polysilicon film and/or a metal film, e.g., a tungsten film. If the metal film is used as the conductive layer, a barrier film such as a Ti/TiN film may be further formed before the metal film is formed.

Next, the bit lines 174 are covered with a capping film 176, and the resultant structure is planarized until the surface of the reverse patterns 170 is exposed. The capping film 176 may have a thickness of about 100 Å to about 5000 Å and can be planarized by etch back, CMP and/or other techniques. In some embodiments, the capping film 176 should also have a high etching selectivity to the patterned mask film 160a. Therefore, the capping film 176 may be formed of the same material as the third insulating film 150. Therefore, the bit line stacks 180 are formed on the region shown in the layout of FIG. 2, by using the damascene method. Each of the bit line stacks 180 includes the bit lines 174, the capping film 176 thereon, and the first spacer 172 on sidewalls thereof.

Referring to FIG. 6C, the capping film 176, the third insulating film 150b, and the patterned mask film 160a having a high etching selectivity coexist on a surface of the resultant structure, and the patterned mask film 160a is left only where the storage node contact plug is to be formed.

Figure 7A:
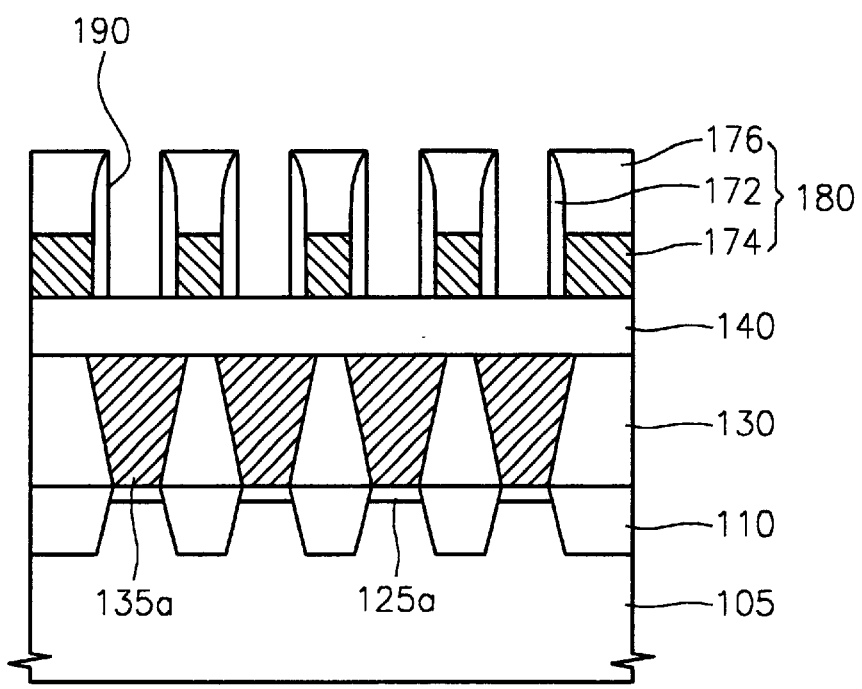
Figure 7B:
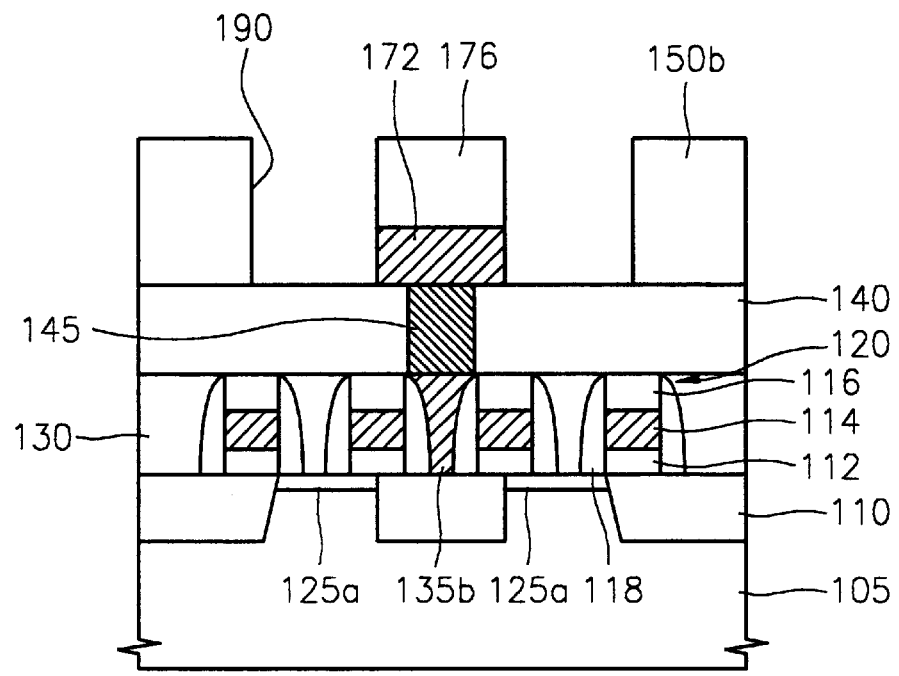
Figure 7C:
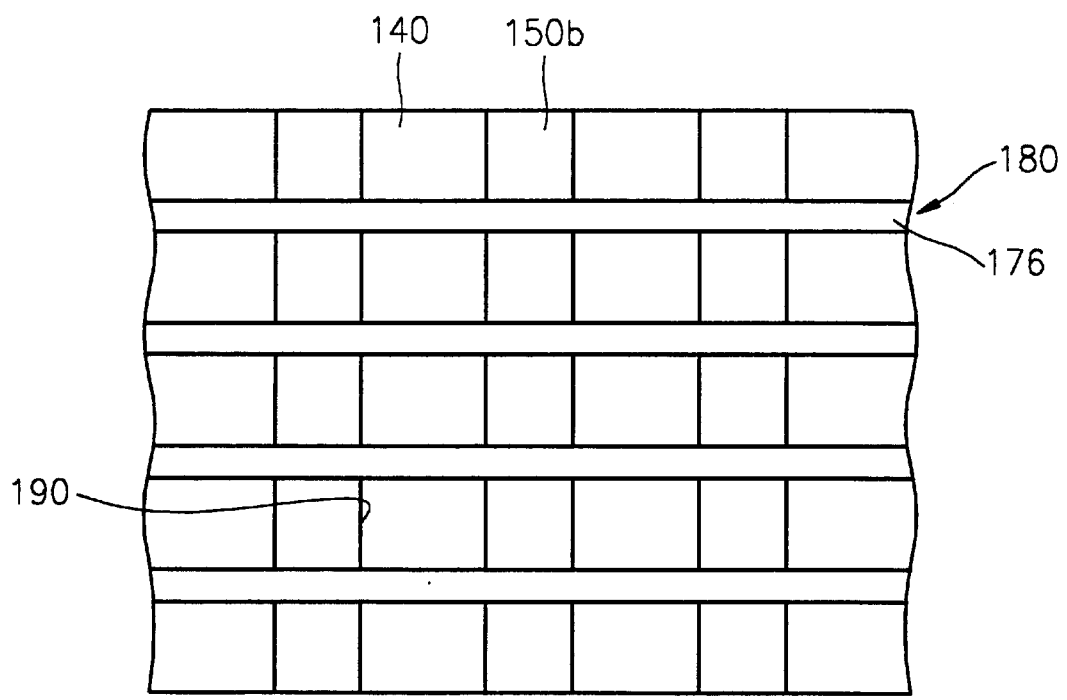

Referring to FIGS. 7A through 7C, the patterned mask film 160a is wet etched selectively to form the storage node contact holes 190 which expose the second insulating film 140 thereunder. In some embodiments, the patterned mask film 160a comprises a nitride film, and the third insulating film 150b, the first spacer 172, and the capping film 176 comprise an oxide film. Therefore, it is possible to selectively remove only the patterned mask film 160a using a stripping method using phosphoric acid.

As described above, in these embodiments, the storage node contact hole region is obtained by covering the region where the storage node contact hole is to be formed with the patterned mask film and then forming the damascene bit line. After that, the storage node contact hole is formed by removing the patterned mask film. The misalignment margin maybe fully obtained in comparison to conventional methods where the storage node contact hole is formed using a photolithography process after the bit line is formed, and therefore it is possible to fabricate a semiconductor device with few, if any, short circuits occurring between the bit line and the storage node contact plug. In addition, the size of a storage node contact hole can be larger than that of the conventional storage node contact hole.

Figure 8A:
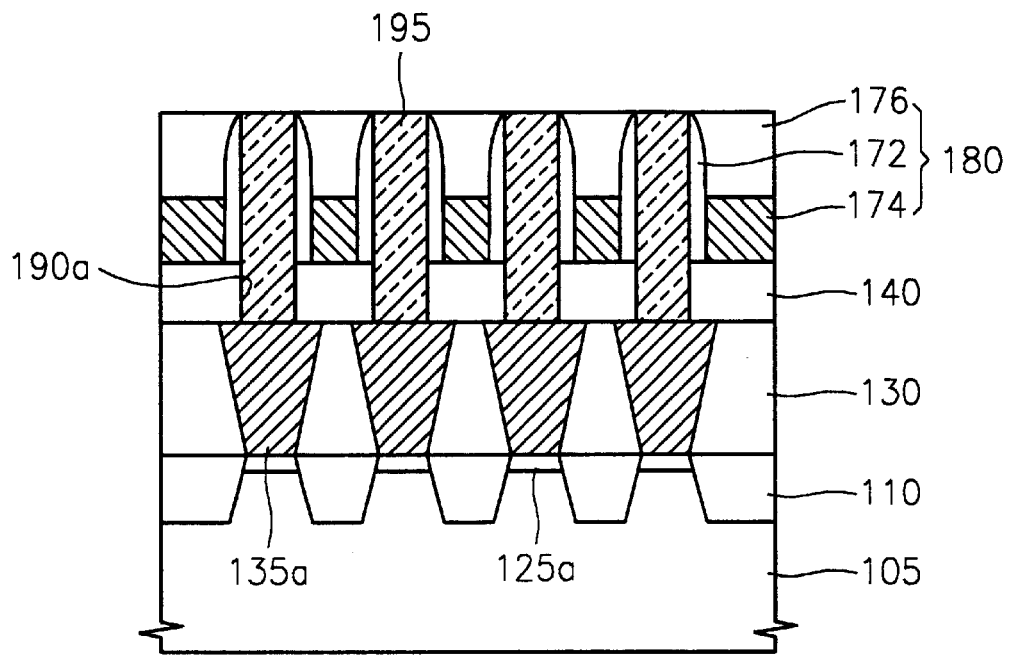
Figure 8B:
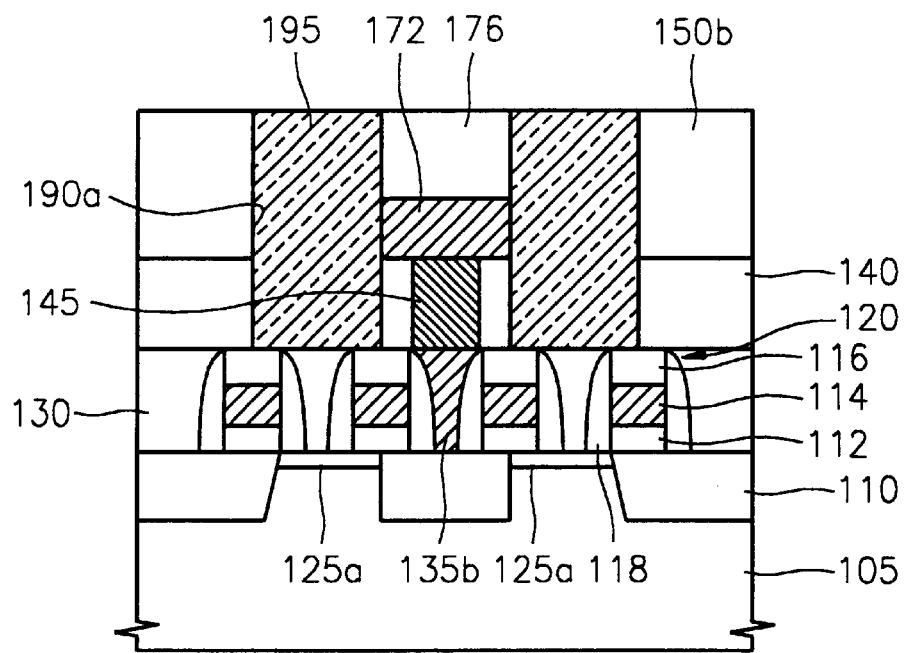
Figure 8C:
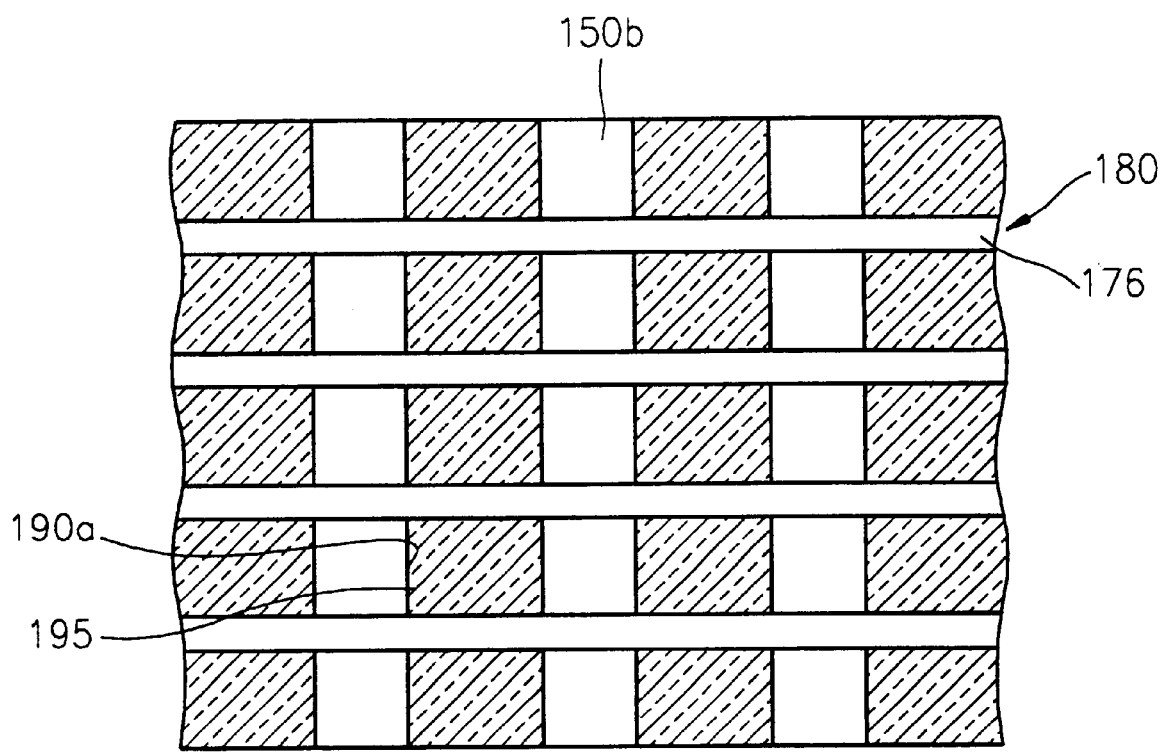

Referring to FIGS. 8A through 8C, in some embodiments, the exposed second insulating film 140 is dry etched to extend the lower portions of aligned storage node contact holes 190 with the bit line stacks 180. Reference numeral 190a indicates aligned storage node contact hole of which the lower portion is extended. In the descriptions with reference to FIGS. 7A through 7C, if the storage node contact holes are etched back, the second insulating film 140 is etched such that aligned storage node contact holes 190a are formed. Then, the storage node contact plug 195 is formed by at least partially filling the storage node contact holes 190a with a conductive substance.

Third Embodiments

Parts of these embodiments are the same as the second embodiments and the descriptions with reference to FIGS. 7A through 7C, and those descriptions will not be repeated here.

Figure 9A:
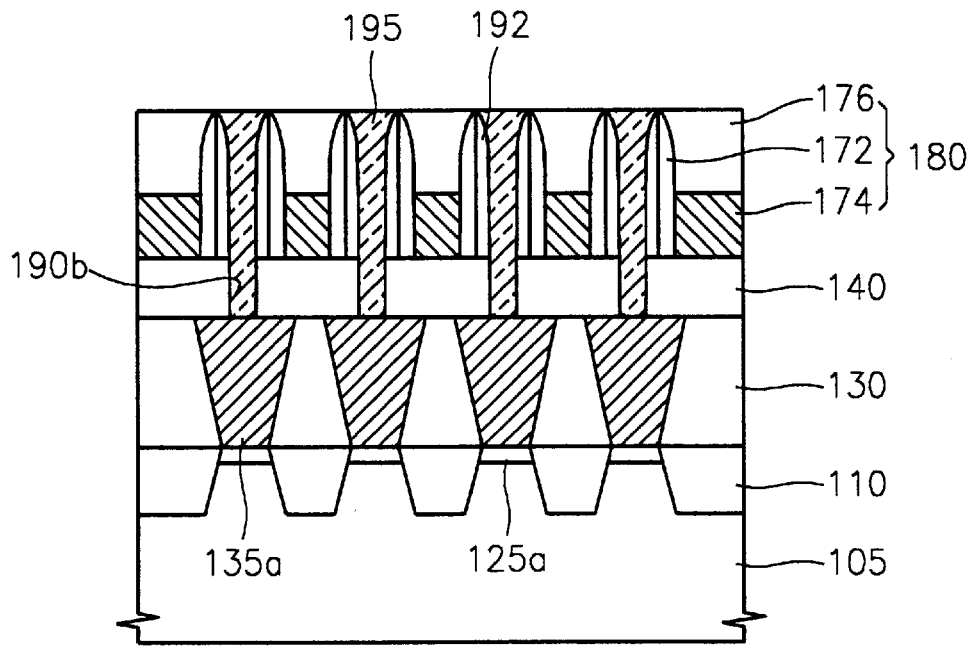
FIGS. 9A and 9B are sectional views, taken along lines a—a' and b—b', respectively, of FIG. 2, showing methods for fabricating semiconductor devices according to third embodiments of the present invention.
Figure 9B:
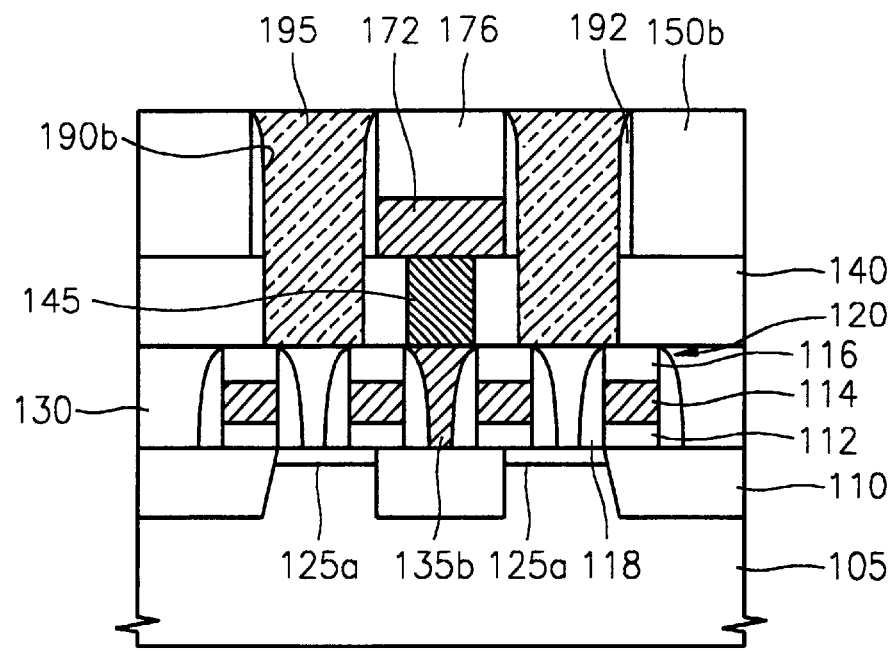

Referring to FIGS. 9A and 9B, after forming the storage node contact holes 190, which expose the second insulating film 140, by wet etching the patterned mask film 160a, a second spacer 192 is formed on the sidewalls of the storage node contact holes 190. Then, the second insulating film 140 is dry etched using the third insulating film 150b and the second spacer 192 as etching masks, such that the lower portion of each of the storage node contact holes 190 is extended. Reference numeral 190b indicates the storage node contact holes 190 which have extended the lower portion. Subsequently, the storage node contact holes are at least partially filled with a conductive substance to form the storage node contact plugs 195. Forming the second spacer 192 improves the insulating characteristics between the storage node contact plugs 195 and the bit lines 174.

Fourth Embodiments

Parts of these embodiments are the same as the second embodiments and the descriptions with reference to FIGS. 7A through 7C, and those descriptions will not be repeated here.

Figure 10A:
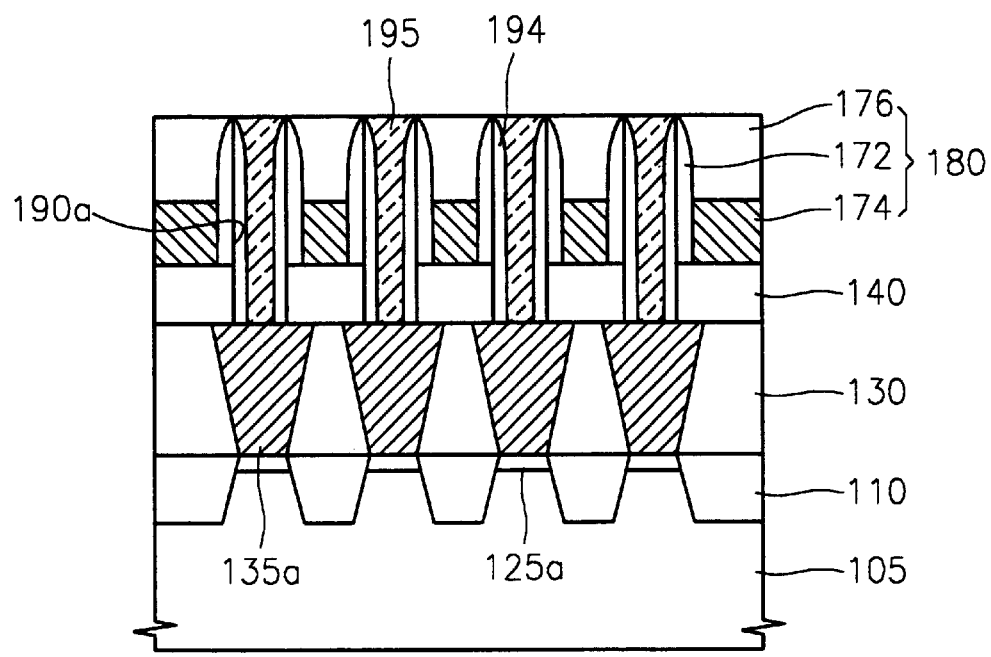
FIGS. 10A and 10B are sectional views, taken along lines a—a' and b—b', respectively, of FIG. 2, showing methods for fabricating semiconductor devices according to fourth embodiments of the present invention.
Figure 10B:
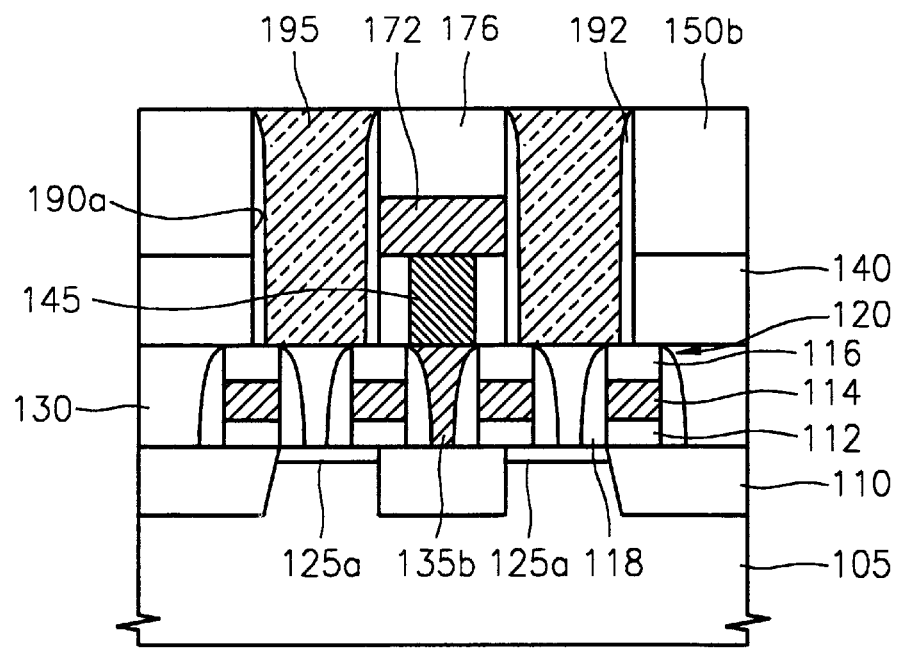

Referring to FIGS. 10A and 10B, the patterned mask film 160a is wet etched to form the storage node contact holes 190 which expose the second insulating film 140, and the exposed second insulating film 140 is dry etched to extend the lower portions of the storage node contact holes 190 naturally aligned to the bit line stacks 180. Reference numeral 190a indicates the aligned storage node contact holes which have extended the lower portion. In the descriptions with reference to FIGS. 7A through 7C, if the storage node contact holes are etched back, the second insulating film 140 is etched such that aligned storage node contact holes 190a are formed.

Next, a third spacer 194 is formed on the sidewalls of the storage node contact holes 190a, and then the storage node contact holes 190a are at least partially filled with a conductive substance to form the storage node contact plugs 195. Forming the third spacer 194 can improve the insulation between the storage node contact plugs 195 and the bit lines 174.

As described above, in the second through fourth embodiments, a photolithography process for forming the storage node contact holes may be performed prior to a photolithography process for forming the bit line instead of a conventional process where the photolithography process for forming the bit line, an insulating film deposition, and the photolithography process for forming the storage node contact holes are sequentially performed. Therefore, short circuits between the storage node contact plug and the bit line may be reduced or eliminated. In addition, the photolithography process, which is short of the misalignment margin according to conventional methods, is performed prior to the photolithography process for forming the bit line in embodiments of the present invention, and then it is possible to obtain the misalignment margin. Further, the size of the storage node contact hole can be enlarged such that a contact resistance is decreased.

According to the above description, since the photolithography process for forming the contact holes or the storage node contact holes can be performed prior to the photolithography process for forming the interconnection or the bit line in some embodiments, it is possible to obtain sufficient misalignment margin. Therefore, the size of the contact hole or the storage node contact hole can be enlarged so that contact resistance can be decreased.

If the photolithography process for forming the contact holes or the storage node contact holes is skipped and the pattern of the lower layer is etched, the contact holes or the storage node contact holes can be formed without considering the misalignment margin of the interconnection or the bit line, in some embodiments. Therefore, the process can be performed with reduced likelihood of creating short circuits between a contact plug and an interconnection or a storage node contact plug and a bit line.

Since the process can be simplified and the misalignment margin can be obtained, it is possible to sharply reduce the design rule, which can enhance the integration of the semiconductor device. Moreover, there is provided a large enough contact margin without the need to use a complex process, and thereby the manufacturing yield of semiconductor devices can be improved.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method for fabricating a semiconductor device, the method comprising:
    depositing a lower insulating film, and an upper insulating film having line patterns therein, on a substrate;
    forming a mask film in spaces between the line patterns and planarizing the mask film until a surface of the line patterns is exposed;
    forming grooves in the upper insulating film, which extend across the line patterns, by patterning the line patterns and the mask film;
    forming a spacer on sidewalls of the grooves and forming a conductive layer in the grooves between the sidewalls;
    covering the conductive layer with a capping film and planarizing the capping film until a surface of the patterned mask film is exposed;
    forming contact holes that are aligned to the conductive layer by selectively removing the mask film between adjacent portions of the conductive layer and the capping film;
    extending the contact holes by removing the lower insulating film beneath the contact holes; and
    forming contact plugs by forming a conductive substance in the contact holes.

2. The method of claim 1, wherein the mask film comprises a film having an etching selectivity to the upper insulating film and the capping film.

3. The method of claim 1, wherein the mask film comprises a nitride film and the upper insulating film and the capping film comprise oxide films.

4. The method of claim 1, wherein the planarizing the mask film comprises etching back and/or chemical mechanical polishing (CMP) the mask film.

5. The method of claim 1, wherein the method used for planarizing the capping film comprises etching back and/or CMP the capping film.

6. The method of claim 1, wherein the method further comprises forming a spacer on sidewalls of the contact holes.

7. A method for fabricating a semiconductor device, the method comprising:
    forming gate stacks on, and sources/drains in, a substrate;
    covering spaces between the gate stacks with a first insulating film and planarizing the first insulating film;
    forming first cell pads connected to respective sources and second cell pads connected to respective drains through the first insulating film;
    forming a second insulating film on the first insulating film, the first cell pads, and the second cell pads;
    forming bit line contact plugs contacting the second cell pads through the second insulating film;
    forming a third insulating film on the second insulating film and the bit line contact plugs;
    forming line patterns which expose a region where a storage node contact plug is to be formed and is parallel to the gate stacks, by etching the third insulating film;
    covering spaces between the line patterns with a mask film and planarizing the mask film until a surface of the line patterns is exposed;
    forming reverse patterns which define grooves for bit lines, by patterning the line patterns and the mask film at the same time;
    forming a first spacer on the sidewalls of the reverse patterns;

forming the bit lines by covering spaces between the reverse patterns, where the first spacer is formed, with a conductive layer;

covering the bit lines with a capping film which fills spaces between the reverse patterns and planarizing the capping film until the reverse patterns are exposed;

forming storage node contact holes, which expose the second insulating film, by wet etching the patterned mask film of the resultant structure where the capping film is formed;

extending the lower portion of the storage node contact holes by dry etching the exposed second insulating film; and forming the storage node contact plugs by filling the storage node contact holes with a conductive substance.

8. The method of claim 7, wherein the third insulating film has a thickness of about 500 Å to about 7000 Å.

9. The method of claim 7, wherein the mask film comprises a film having a wet-etching selectivity to the third insulating film, the first spacer, and the capping film.

10. The method of claim 7, wherein the mask film comprises a nitride film and the third insulating film, the first spacer, and the capping film comprise oxide films.

11. The method of claim 7, wherein the mask film has a thickness of about 500 Å to about 10000 Å.

12. The method of claim 7, wherein the planarizing the mask film comprises etching back and/or CMP the mask film.

13. The method of claim 7, wherein the first spacer has a thickness of about 100 Å to about 2000 Å.

14. The method of claim 7, wherein the capping film has a thickness of about 100 Å to about 5000 Å.

15. The method of claim 7, wherein the planarizing the capping film comprises etching back and/or CMP the capping film.

16. The method of claim 7, further comprising forming a second spacer on inner walls of the storage node contact holes and extending the lower portions of the storage node contact holes by dry etching the exposed second insulating film, using the capping film and the second spacer as etching masks, after forming storage node contact holes, which expose the second insulating film, by wet etching the patterned mask film where the capping film is formed.

17. The method of claim 7, wherein the method further comprises forming a third spacer on the inner walls of the extended storage node contact holes, after extending the lower portions of the storage node contact holes.

18. A method of fabricating a semiconductor device comprising:

forming a series of alternating first and second elongated regions on a substrate;

etching a plurality of elongated trenches that are nonparallel to and extend across the series of first and second elongated regions on the substrate;

placing material in the plurality of elongated trenches; and selectively removing portions of the first and/or second elongated regions between adjacent ones of the plurality of elongated trenches that contain material therein.

19. A method according to claim 18 further comprising placing conductive material in at least some of the portions of the first and/or second elongated regions that are selectively removed.

20. A method according to claim 19 wherein the following is performed between the selectively removing and the placing conductive material:

etching a plurality of holes beneath at least some of the portions of the first and/or second elongated regions that are selectively removed; and wherein the placing conductive material comprises placing conductive material in at least some of the portions of the first and/or second elongated regions that are selectively removed and in at least some of the plurality of holes beneath the portions of the first or second elongated regions that are selectively removed.

21. A method according to claim 18 wherein the placing material comprises:

forming sidewall spacers in the plurality of elongated trenches; and placing conductive material between the sidewall spacers.

22. A method according to claim 18:

wherein the sidewall spacers include a first portion adjacent the substrate and a second portion remote from the substrate; and wherein the placing conductive material comprises placing conductive material between the first portions of the sidewall spacers;

the method further comprising placing insulating material between the second portions of the sidewall spacers.

23. A method according to claim 19 wherein the first and second regions are first and second insulating regions.

24. A method according to claim 19 wherein the following is performed between the selectively removing and the placing conductive material:

forming sidewall spacers in at least some of the portions of the first and/or second elongated regions that are selectively removed; and wherein the placing conductive material comprises placing conductive material between the sidewall spacers.

* * * * *